United States Patent
Lin et al.

(10) Patent No.: US 6,294,295 B1
(45) Date of Patent: Sep. 25, 2001

(54) VARIABLE TRANSMITTANCE PHASE SHIFTER TO COMPENSATE FOR SIDE LOBE PROBLEM ON RIM TYPE ATTENUATING PHASE SHIFTING MASKS

(75) Inventors: Chia-Hui Lin, Hsin-Chu; San-De Tzu; Wei-Zen Chou, both of Taipei, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/519,612

(22) Filed: Mar. 6, 2000

(51) Int. Cl.[7] .................................................. G03F 9/00
(52) U.S. Cl. ............................................................. 430/5
(58) Field of Search ................................ 430/5, 322, 323; 716/19, 20, 21; 250/492.22; 216/96

(56) References Cited

U.S. PATENT DOCUMENTS

| 5,725,973 | 3/1998 | Han et al. ................................. 430/5 |
| 5,786,114 | 7/1998 | Hashimoto ............................... 430/5 |
| 5,849,439 | 12/1998 | Mitsui ..................................... 430/5 |
| 5,882,827 | 3/1999 | Nakao ..................................... 430/5 |
| 6,057,064 | * 5/2000 | Lin ......................................... 430/5 |

* cited by examiner

Primary Examiner—S. Rosasco
(74) Attorney, Agent, or Firm—George O. Saile; Stephen B. Ackerman; Larry J. Prescott

(57) ABSTRACT

This invention describes an attenuating phase shifting mask, a method of forming the attenuating phase shifting mask, and a method of using the attenuating phase shifting mask to expose a contact hole pattern having both dense and isolated contact holes on a layer of photosensitive dielectric. The mask has a rim of first attenuating phase shifting material, having a first transmittance and providing a phase shift of 180°, surrounding the dense holes and a rim of second attenuating phase shifting material, having a second transmittance and providing a phase shift of 180°, surrounding the isolated holes. The second transmittance is greater than the first transmittance. The dense holes have a duty ratio of less than 2.0 and the isolated holes have a duty ratio of greater than or equal to 2.0. The second attenuating phase shifting material results from treating the first attenuating phase shifting material for a first time with a first solution which increases the transmittance and changes the phase shift. The attenuating phase shifting material is then treated with a second solution for a second time to restore the phase shift to 180° and further increase the transmittance.

21 Claims, 12 Drawing Sheets

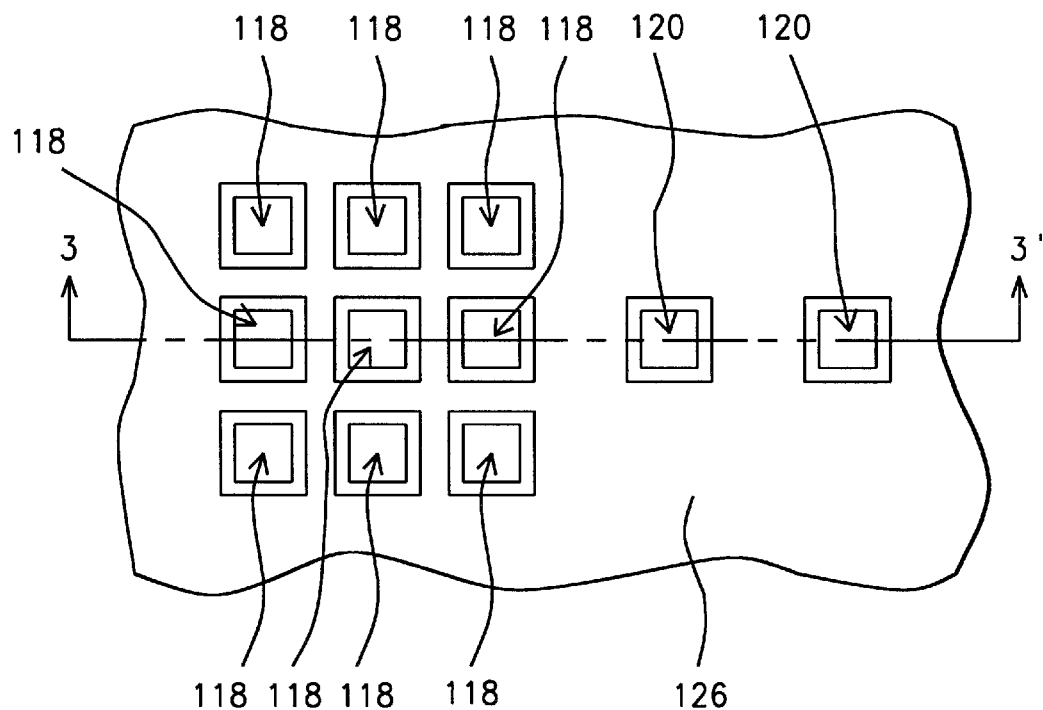
FIG. 2 — Prior Art
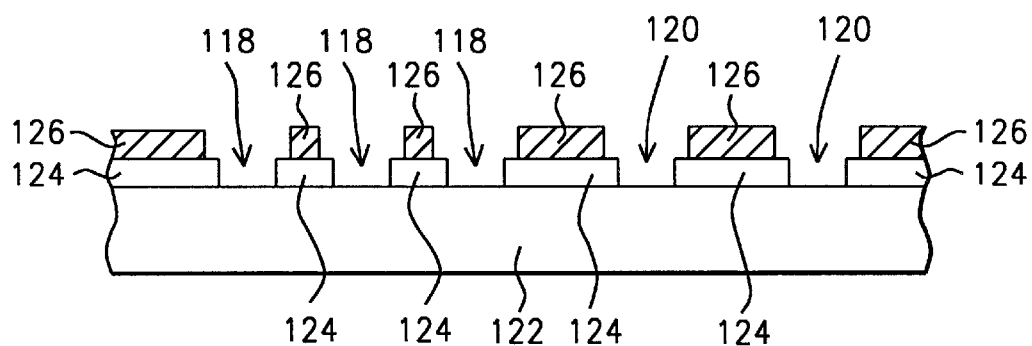
FIG. 3 — Prior Art

VARIABLE TRANSMITTANCE PHASE SHIFTER TO COMPENSATE FOR SIDE LOBE PROBLEM ON RIM TYPE ATTENUATING PHASE SHIFTING MASKS

BACKGROUND OF THE INVENTION (1) Field of the Invention

This invention relates to rim type attenuating phase shifting masks used for forming contact holes and more specifically to the use of different transmittance phase shifting materials for pattern regions having different duty ratios.

(2) Description of the Related Art

Attenuating phase shifting masks find wide usage in the printing of contact holes on a layer of photoresist formed on an integrated circuit wafer. In those patterns which have contact holes on dense sub patterns and contact holes on more isolated sub patterns it is a problem to optimize the mask for the different sub pattern regions. At lower sigma settings the depth of focus is greater for the isolated pattern than for the more dense pattern, however side lobe effect problems become more significant. At higher sigma settings the depth of focus is smaller for the isolated pattern than for the more dense pattern, however side lobe effect problems are decreased. The value of sigma is a measure of the degree of coherence of the light used to project the mask pattern. A smaller the value of sigma indicates a greater coherence of light. For completely coherent light the value of sigma is zero. For incoherent light the value of sigma is 1.0. The value of sigma is variable in the exposure system and depends on the process settings. Projection systems typically use light having a value of sigma of about 0.6.

The depth of focus can be increased by increasing the transmittance of the attenuating phase shifting material but this causes side lobe problems in the dense portions of the mask. Trade-offs are necessary between the depth of focus of the different pattern regions; problems due to side lobe effect; and the degree of coherence of the light used to project the mask pattern.

U.S. Pat. No. 5,725,973 to Han et al. describes a photomask for suppressing proximity effect in a mask pattern. The proximity effect is suppressed by forming an optical transmittance control film pattern in the transmission area between opaque mask patterns.

U.S. Pat. No. 5,786,114 to Hashimoto describes a phase shift mask having phase shift portions of both Levenson type and Halftone type. A method of controlled oxidation of the halftone material to increase and stabilize the transmittance of the halftone material is described.

U.S. Pat. No. 5,882,827 to Nakao describes a phase shift mask of both Levenson type and Halftone type.

U.S. Pat. No. 5,849,439 to Mitsui describes a method of controlling the transmittance and thickness of phase shifting material using a reverse sputtering process.

U.S. patent application Ser. No. 09/473,027 (TSMC-99-118), Filed Dec. 28, 1999, entitled "USING DIFFERENT TRANSMITTANCE WITH ATTENUATE PHASE SHIFT MASK (APSM) TO COMPENSATE ADI CRITICAL DIMENSION PROXIMITY", and assigned to the same Assignee describes the use of different transmittance light absorbing materials for forming line/space patterns and contact hole patterns having different duty ratios.

SUMMARY OF THE INVENTION

FIG. 1 shows a top view of a part of a mask used to form contact holes in an integrated circuit wafer. The mask has a pattern of contact holes 112 forming a regular array with the contact holes 112 having a width 114 and a distance 116 between the outer perimeter of adjacent contact holes 112. An important parameter of the mask is the duty ratio of the holes which is equal to the distance 116 between the outer perimeter of adjacent contact holes 112 divided by the width 114 of the contact holes 112.

FIGS. 2 shows a top view and FIG. 3 a cross section view of a conventional rim type phase shifting mask, using attenuating phase shifting material, used to form contact holes in both a dense pattern and a more isolated pattern. The mask shown in FIGS. 2 and 3 has contact holes 118 on a dense pattern with a low duty ratio and contact holes 120 on a more isolated pattern having a larger duty ratio. As can be seen in the cross section view shown in FIG. 3, the mask is a rim type mask formed on a transparent mask substrate 122, such as quartz, having a rim of attenuating phase shifting material 124 surrounding both the holes 118 on a dense pattern and the holes 120 on a more isolated pattern. Opaque material, such as chrome 126, is formed over the mask except those regions of the mask occupied by the transparent holes 118 on a dense pattern, the transparent holes 120 on a more isolated pattern, and the attenuating phase shifting rims surrounding the holes, 118 and 120.

The mask shown in FIGS. 2 and 3 is used with a photolithographic projection system, shown schematically in FIG. 24. The projection system has an illumination system 40, a mask holder 44, an objective lens 48, and a wafer holder 50. A mask 46 is placed in the mask holder 44 and a wafer 52 is placed on the wafer holder. Light 42 from the illumination system 40 is used to project the pattern in the mask 46 onto the wafer 52. The sigma of the light 42 from the illumination system 40 can be varied by the illumination system. The value of sigma is a measure of the degree of coherence of the light 42 from the illumination system. For completely coherent light the value of sigma is zero. For incoherent light the value of sigma is 1.0. Projection systems typically use light having a value of sigma of about 0.6.

Problems can be encountered in using this system to transfer a mask pattern, such as that shown in FIGS. 2 and 3, to a substrate. At lower sigma settings for the light 42 from the illumination system 40, see FIG. 24, the depth of focus is greater for the isolated pattern than for the more dense pattern, however side lobe effect problems become more significant. At higher sigma settings for the light 42 from the illumination system 40 the depth of focus is smaller for the isolated pattern than for the more dense pattern, however side lobe effect problems are decreased. The depth of focus can be increased by increasing the transmittance of the attenuating phase shifting material 124, see FIG. 3, but higher transmittance attenuating phase shifting material increases the problem of side lobe effect for the part of the pattern having dense holes 118. The side lobe effect for the part of the pattern having dense holes 118 can be reduced by increasing the value of sigma for the light 42 from the illumination system 40 but this will also reduce the depth of focus for the part of the pattern having isolated holes 120.

It is a principle objective of this invention to provide a mask for forming contact holes having both a dense hole pattern and a more isolated hole pattern which avoids the problem of side lobe effect and has a good depth of focus for both the dense hole pattern and isolated hole pattern.

It is another principle objective of this invention to provide a method of forming a mask for forming contact holes having both a dense hole pattern and a more isolated hole pattern which avoids the problem of side lobe effect and has a good depth of focus for both the dense hole pattern and isolated hole pattern.

It is another principle objective of this invention to provide a method of forming contact holes in an integrated circuit wafer, wherein the contact holes have both a dense hole pattern and a more isolated hole pattern, which avoids the problem of side lobe effect and has a good depth of focus for both the dense hole pattern and isolated hole pattern.

These objectives are achieved with a rim type contact hole mask using attenuating phase shifting material having a first transmittance for the rims around the holes in the dense hole pattern region and a second transmittance, greater than the first transmittance, for the rims around the holes in the isolated hole pattern region. The transmittance of the attenuating phase shifting material is adjusted by chemical treatment of the attenuating phase shifting material. In this chemical treatment of the attenuating phase shifting material a first chemical treatment changes both the transmittance and the phase angle. A second chemical treatment, which further changes the transmittance, must be employed to return the phase shift to 180°.

BRIEF DESCRIPTION OF THE DRAWINGS

FIG. 2 shows a top view of a conventional rim type mask using attenuating phase shifting material for forming contact holes on both dense and more isolated contact hole patterns.

FIG. 3 shows a cross section view of the conventional rim type mask using attenuating phase shifting material of FIG. 2 taken along line 3–3' of FIG. 2.

DESCRIPTION OF THE PREFERRED EMBODIMENTS

Figure 1:
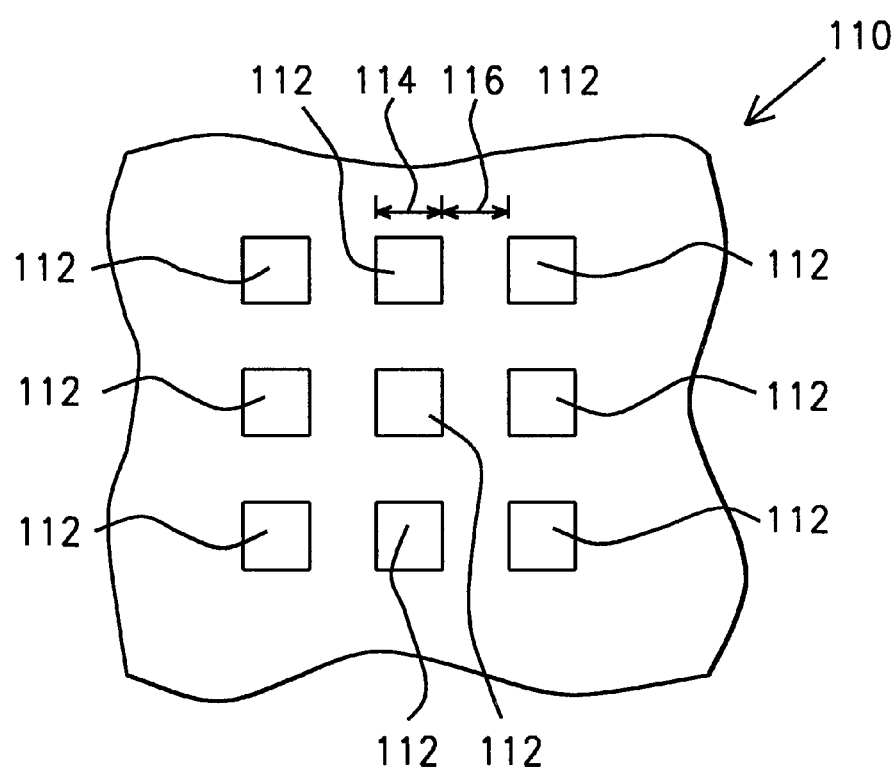
FIG. 1 shows a top view of a contact hole pattern.
Figure 4:
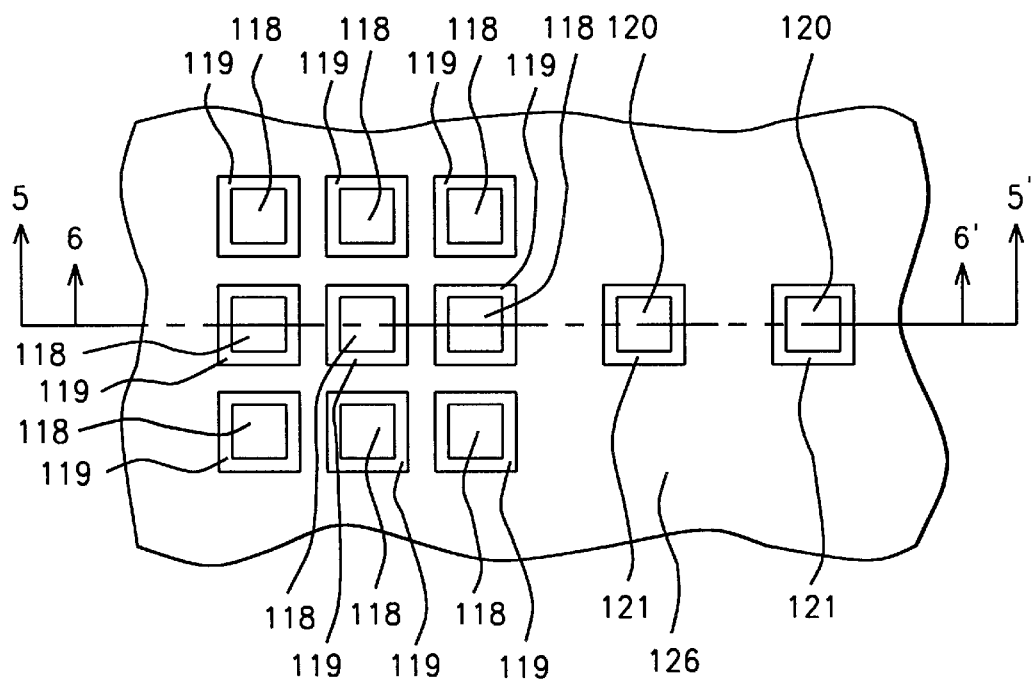
FIG. 4 shows a top view of a rim type mask of this invention using attenuating phase shifting material having two transmittances for forming contact holes on both dense and more isolated contact hole patterns.
Figure 5:
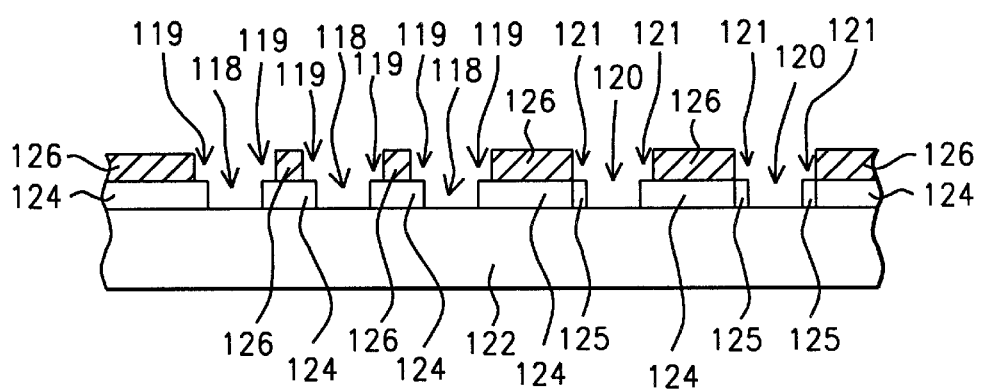
FIG. 5 shows a cross section view of the rim type mask of this invention using attenuating phase shifting material having two transmittances. The cross section view is taken along line 5–5' of FIG. 4.

Refer now to FIGS. 1 and 4–5 for a description of the mask of this invention, for forming contact holes. FIG. 1 shows an array of contact holes 112 in a regular pattern. The contact holes are typically square having a width 114 and are located in an array with a distance 116 between the outer perimeter of adjacent contact holes. The duty ratio of the array of contact holes 112 is the distance 116 between the contact holes 112 divided by the width 114 of the contact holes 112. In these embodiments when the duty ratio is less than 2.0, the distance 116 between adjacent contact holes is less than twice the width 114, the contact holes are considered to be in a dense contact hole pattern. When the duty ratio is greater than or equal to 2.0 the contact holes are considered to be in a more isolated contact hole pattern. In the descriptions that follow dense contact holes will refer to contact holes having a duty ratio of less than 2.0 and isolated contact holes will refer to contact holes having a duty ratio equal to or greater than 2.0.

FIG. 4 shows a top view and FIG. 5 shows a cross section view of a first embodiment of the rim type attenuating phase shifting mask of this invention. FIG. 5 is a cross section view of the mask of FIG. 4 taken along line 5–5' of FIG. 4. FIGS. 4 and 5 show an array of first holes 118, which are dense contact holes, and an array of second holes 120, which are isolated contact holes. As can be seen in FIG. 5, the mask is formed on a transparent mask substrate 122, such as quartz. A patterned layer of first attenuating phase shifting material 124, providing a 180° phase shift relative to light passing through the transparent mask substrate 122 at the first holes 118 and having a first transmittance is formed on the transparent mask substrate. In this example the first transmittance is between about 5% and 7% and the layer of first attenuating phase shifting material 124 is MoSiON having a thickness of between about 900 and 1500 Angstroms. A patterned layer of opaque material 126, such as chrome, defines first rims 119 of the first attenuating phase shifting material.

The patterned layer of opaque material 126 also defines second rims 121 of second attenuating phase shifting material 125 surrounding each of the second holes 120. The second attenuating phase shifting material 125 has a second transmittance and provides a 180° phase shift relative to light passing through the transparent mask substrate 122 at the second holes 120. In this example the second transmittance is between about 10% and 20% and the second attenuating phase shifting material is MoSiON which has been treated with a SC1 solution, a 1:1:5 solution of $NH_4OH:H_2O_2:H_2O$, for a first time and a NaOH solution for a second time. The details of the method of treating the MoSiON with a SC1 solution for a first time and a NaOH solution for a second time to achieve a second transmittance and a 180° phase shift will be described in a later embodiment.

Figure 6:
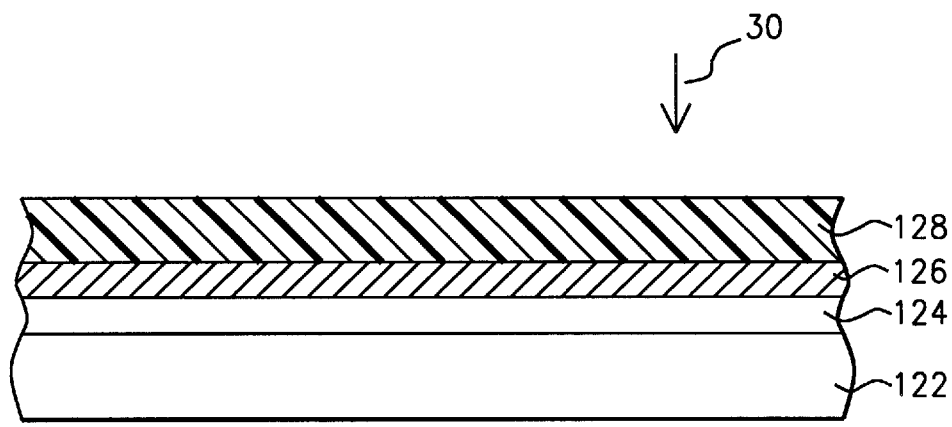
FIG. 6 shows a cross section view of a part of a mask blank for an attenuating phase shifting mask having a first layer of resist formed thereon.

Refer now to FIGS. 6–23 for a preferred embodiment of a method of forming the rim type attenuating phase shifting mask of this invention. FIG. 6 shows a cross section of a part of a mask blank having a transparent mask substrate 122, a layer of attenuating phase shifting material 124 formed on the transparent mask substrate 122, and a layer of opaque material 126 formed on the layer of attenuating phase shifting material 124. In this example the transparent mask substrate 122 is quartz, the attenuating phase shifting material 124 is MoSiON having a thickness of between about 900 and 1500 Angstroms, and the opaque material 126 is chrome. The layer of MoSiON having a thickness of between about 900 and 1500 Angstroms provides a 180° phase shift and has a transmittance of between about 5% and 7%. A layer of first resist 128 is formed on the mask blank over the layer of opaque material and a first pattern is exposed in the layer of first resist using an exposure method such as an electron beam 30.

Figure 7:
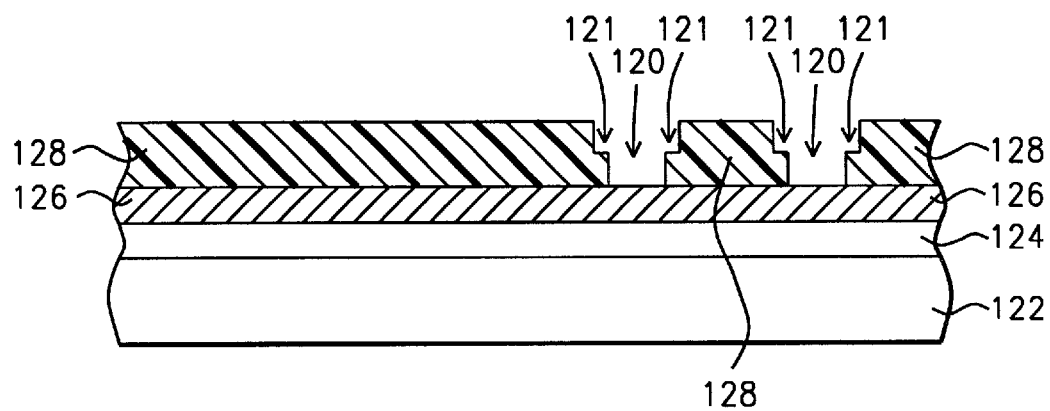
FIGS. 7–19 show the process flow for the method of this invention, beginning with the mask blank of FIG. 6, for forming a rim type attenuating phase shifting mask having different transmittance in different regions of the mask.
Figure 8:
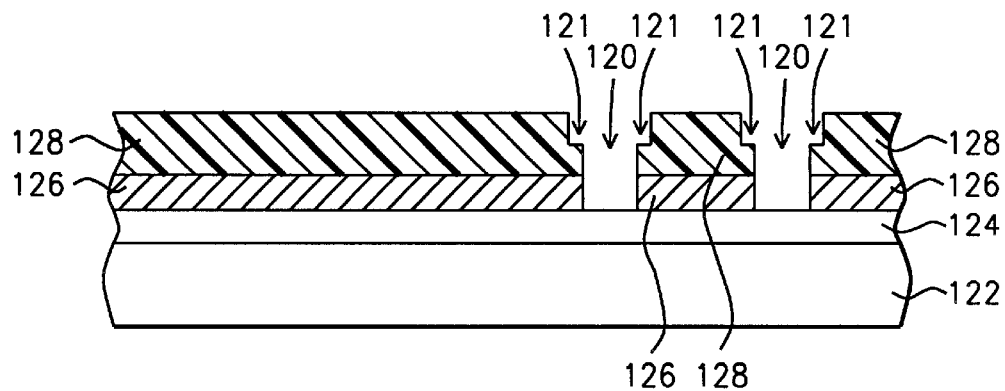
Figure 9:
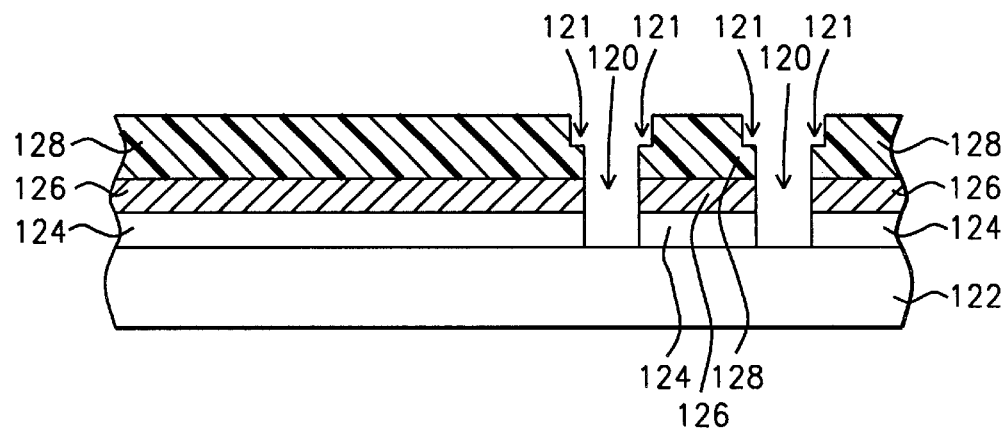
Figure 10:
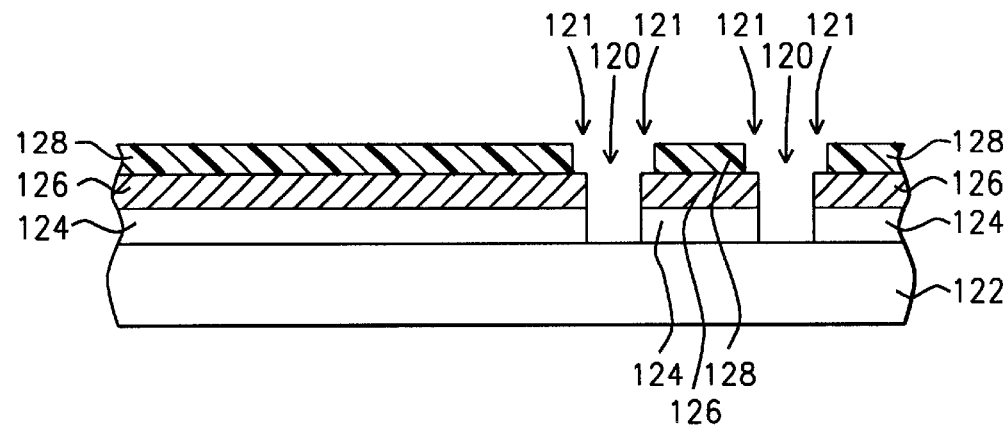
Figure 11:
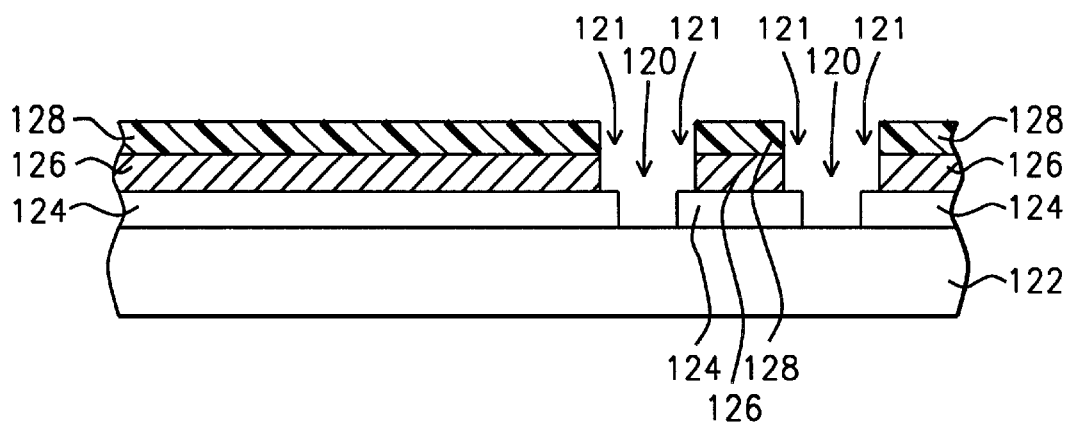
Figure 12:
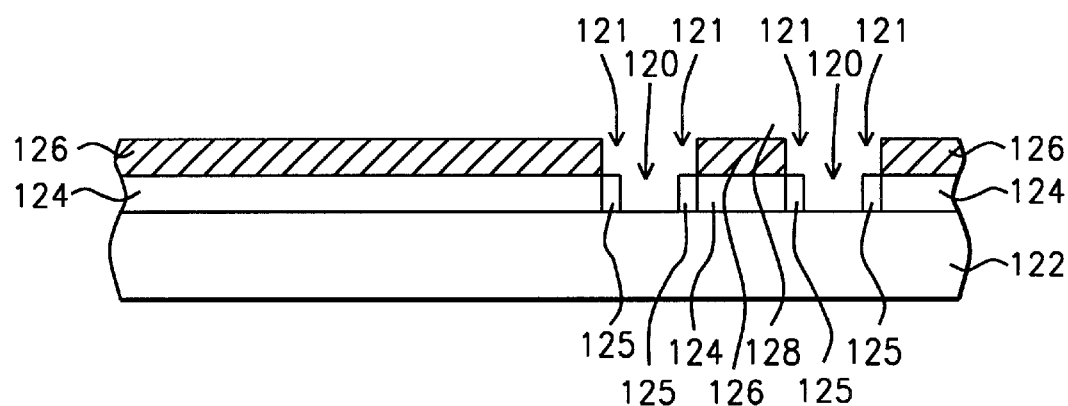

As shown in FIG. 7, the layer of first resist 128 is them developed forming a mask corresponding to the first pattern, which is the part of the mask having the isolated holes. The exposure level of the layer of first resist 128 varies with position so that the first resist at the location of the isolated holes 120 is fully exposed and completely removed and the first resist at the location of the rims 121 surrounding the isolated holes 120 is partially exposed and partially removed by the developing. As shown in FIG. 8 the isolated holes 120 are etched in the layer of opaque material 126 using a first etching means. The first etching means is wet etching using an etchant such as CR-7, $Cl(HClO_4)_x(NO_3)_y$. As shown in FIG. 9 the isolated holes 120 are then etched in the layer of attenuating phase shifting material 124 using a second etching means. The second etching means is dry anisotropic etching using an etchant such as $SF_6+He$ or $CF_4+O_2$. Next, as shown in FIG. 10, part of the layer of first resist 128 is removed using $O_2$ plasma dry etching thereby exposing a rim 121 of opaque material 126. As shown in FIG. 11, the rim of exposed opaque material is etched away using a third etching means thereby exposing a rim 121 of attenuating phase shifting material 124 surrounding the isolated holes 120. The third etching means is dry anisotropic etching. As shown in FIG. 12, the layer of first resist is then stripped.

Figure 20:
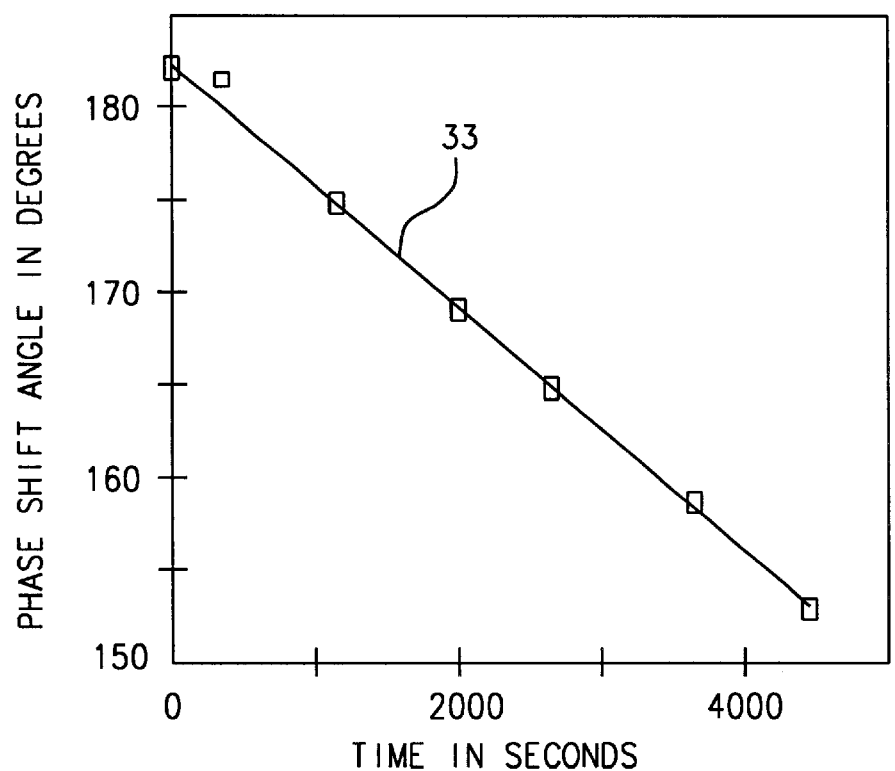
FIG. 20 shows a curve of phase angle as a function of time the attenuating phase shifting material has been subjected to a solution of SC1.
Figure 21:
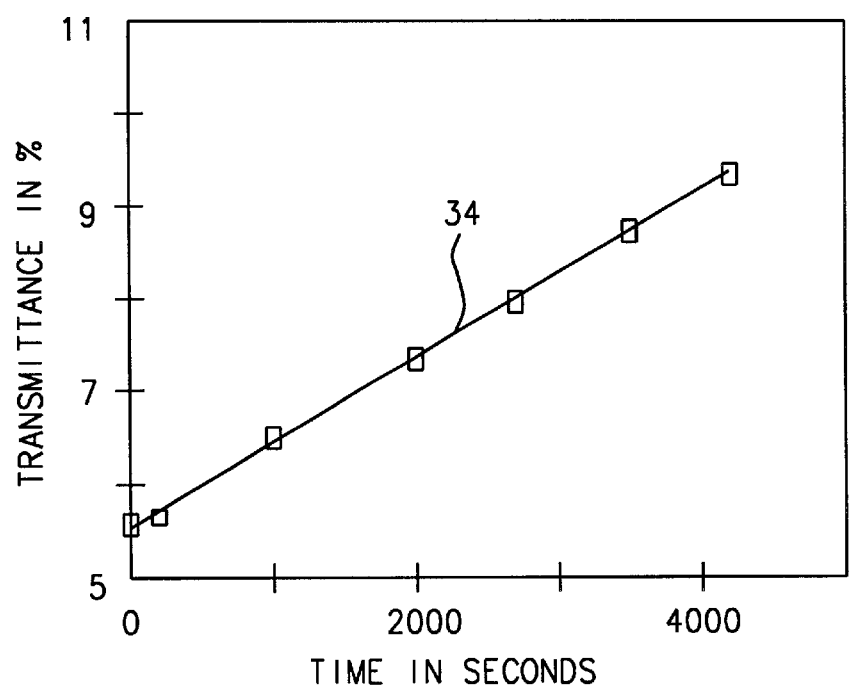
FIG. 21 shows a curve of transmittance as a function of time the attenuating phase shifting material has been subjected to a solution of SC1.

The next steps are the key steps to the method of this invention. As shown in FIG. 12, the rim 121 of attenuating phase shifting material 125 surrounding the isolated holes 120 is exposed with opaque material covering the remainder of the attenuating phase shifting material 124. The exposed attenuating phase shifting material 125 is treated with a first solution for a first time, which increases the transmittance and decreases the phase shift angle provided by the attenuating phase shifting material. This treatment with the first solution places the exposed attenuating phase shifting material 125 in contact with the first solution using a method such as immersion of the mask in the first solution, or the like. For attenuating phase shifting material of MoSiON the first solution is SC1, a 1:1:5 solution of $NH_4OH:H_2O_2:H_2O$. Treatment of the exposed MoSiON with a 1:1:5 solution of $NH_4OH:H_2O_2:H_2O$, SC1, at a temperature of between about 25° C. and 30° C., for a period of time will increase the transmittance of the layer of MoSiON. FIG. 21 shows a curve 34 of transmittance of the layer of MoSiON as a function of time the MoSiON is exposed to SC1. In this curve the transmittances changes at the rate of 0.048%/minute. As shown in FIG. 20 the contact of the exposed MoSiON with the SC1 solution will decrease the phase shift provided by the layer of MoSiON as shown by the curve 33 of phase angle as a function of time in FIG. 20. In this curve the phase shift changes at the rate of −0.432°/minute.

Figure 22:
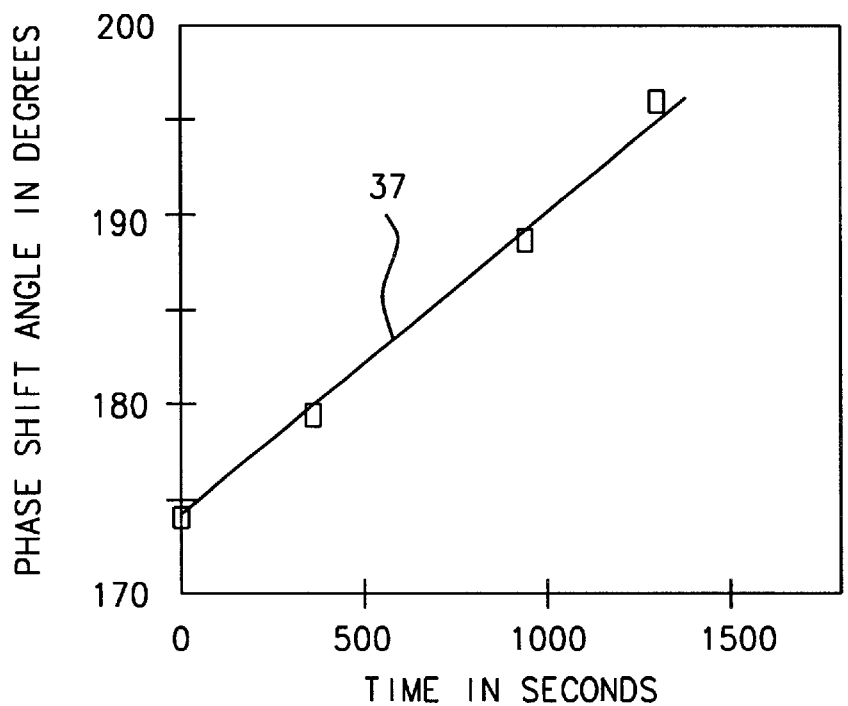
FIG. 22 shows a curve of phase angle as a function of time the attenuating phase shifting material has been subjected to a solution of NaOH.
Figure 23:
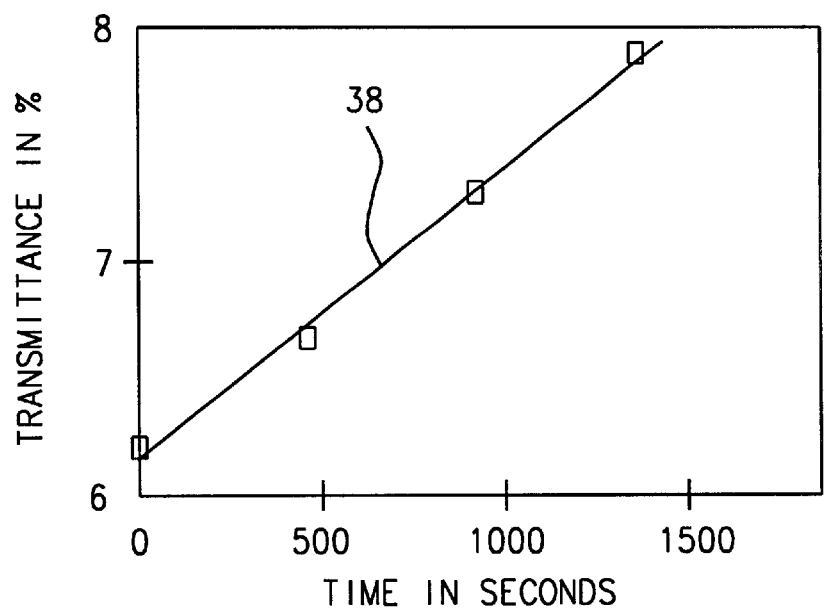
FIG. 23 shows a curve of transmittance as a function of time the attenuating phase shifting material has been subjected to a solution of NaOH.

Next the exposed attenuating phase shifting material 125 is treated with a second solution for a second time, which increases the phase shift angle provided by the attenuating phase shifting material and further increases the transmittance. This treatment with the second solution places the exposed attenuating phase shifting material 125 in contact with the second solution using a method such as immersion of the mask in the second solution, or the like. For attenuating phase shifting material of MoSiON the second solution is a 5.6 liter/mole solution, by volume of sodium hydroxide, NaOH. Treatment of the exposed MoSiON with a 5.6 liter/mole solution, by volume, of sodium hydroxide, NaOH, at a temperature of between about 65° C. and 75° C., for a period of time will increase the phase angle shift provided by the layer of MoSiON. FIG. 22 shows the curve 37 of phase angle shift provided by the layer of MoSiON as a function of time in the solution of NaOH. In this curve the phase angle shift changes at the rate of 1.038°/minute. Contact of the layer of MoSiON with the NaOH solution will further increase the transmittance of the layer of MoSiON. FIG. 23 shows the curve 38 of transmittance as a function of time the layer of MoSiON is in contact with the NaOH solution. In this curve the transmittances changes at the rate of 0.078%/minute.

Figure 25:
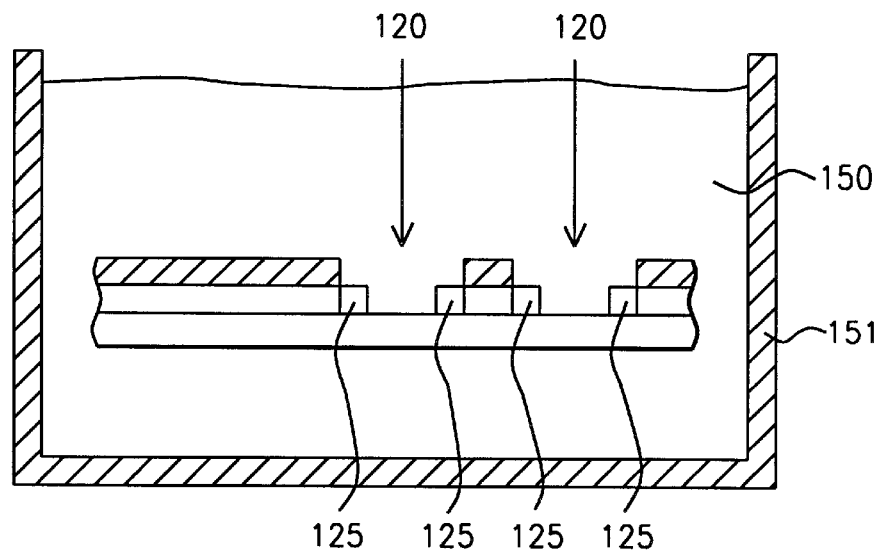
FIG. 25 shows a schematic view of exposing the attenuating the attenuating phase shifting material to a first solution or a second solution by immersing the mask in the first solution or the second solution.
Figure 26:
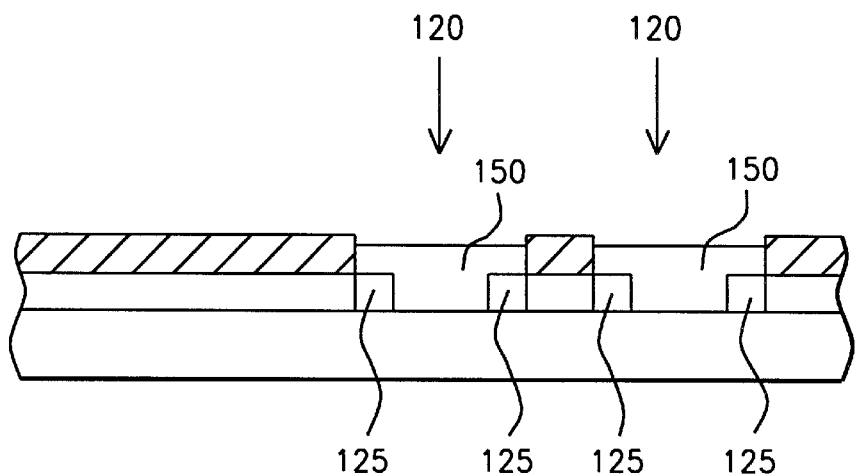
FIG. 26 shows a schematic view of a method of exposing the attenuating phase shifting material to a first solution or a second solution by placing the solution in the isolated contact hole region of the mask.

FIGS. 25 and 26 show schematic views of methods of treating the exposed phase shifting material in contact with either the first solution or the second solution. As shown in FIG. 25 the mask shown in FIG. 12 can be immersed in a container 151 containing a solution 150, which is either the first solution or the second solution. The solution 150 contacts the exposed attenuating phase shifting material 125. As shown in FIG. 26, a solution 150, either the first solution or the second solution, can be placed in the isolated holes 120 of the mask shown in FIG. 12 so that the solution 150 contacts the exposed attenuating phase shifting material 125.

After the exposed attenuating phase shifting material 125, in this example MoSiON, is treated with a first solution, a 1:1:5 solution of $NH_4OH:H_2O_2:H_2O$, for a first time, $t_1$, and with a second solution, NaOH, for a second time, $t_2$, the change in phase angle, PH, and the change in transmittance, TR, will be given by the following equations.

$PH=-t_1 \times 0.432°/minute+t_2 \times 1.038°/minute.$ $TR=t_1 \times 0.048\%/minute+t_2 \times 0.078\%/minute.$ Since the change in phase angle, PH, must be zero the time in the first solution, $t_1$, must be 2.4 multiplied by the time in the second solution, $t_2$. If TR is the desired change in transmittance the time in the second solution, $t_2$, will be given by TR multiplied by 5.176 and the time in the first solution, $t_1$, will be TR multiplied 12.4. The first time, $t_1$, and the second time, $t_2$, will be in minutes when TR is expressed in percent. In this manner any desired change in transmittance of the attenuating phase shifting material can be achieved without changing the phase shift provided by the attenuating phase shifting material.

In this example the transmittance of the untreated MoSiON is between about 5% and 7% and after contact with the first solution of SC1 and the second solution of NaOH the transmittance is increased to between about 10% and 20%. To achieve this change in transmittance the first time, $t_1$, will be between about 60 and 90 minutes and the second time, $t_2$, will be between about 25 and 40 minutes.

Again referring to FIG. 12, the rim 121 of attenuating phase shifting material 125 surrounding the isolated holes 120 will have a transmittance, between about 10% and 20% in this example, greater than the transmittance of the remaining attenuating phase shifting material 124, between about 5% and 7% in this example.

Figure 13:
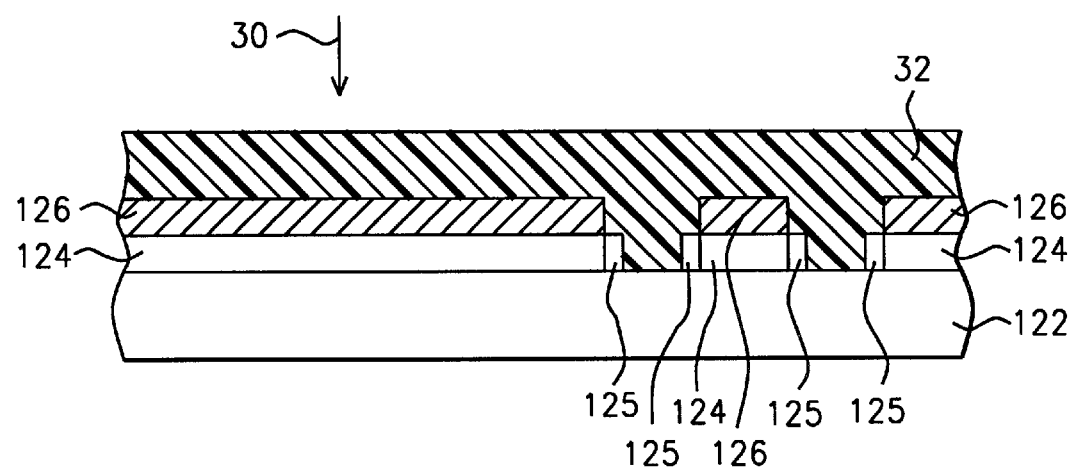
Figure 14:
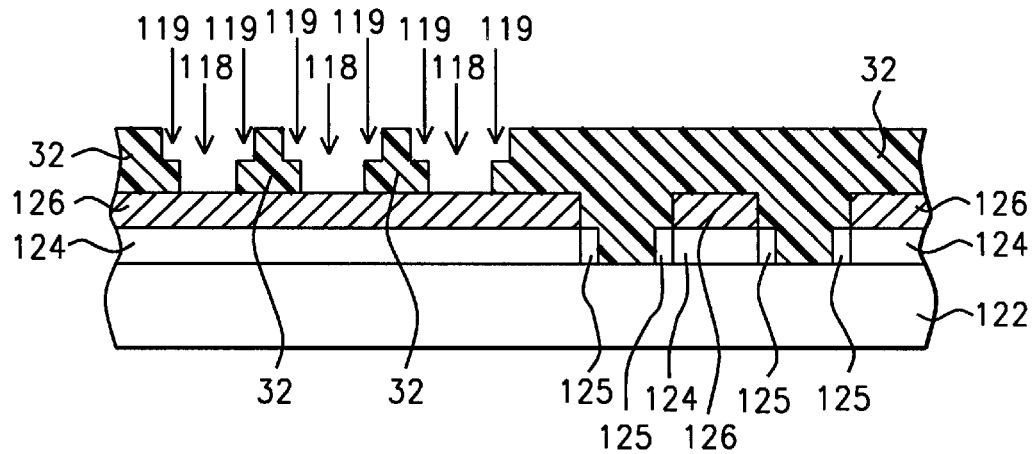
Figure 15:
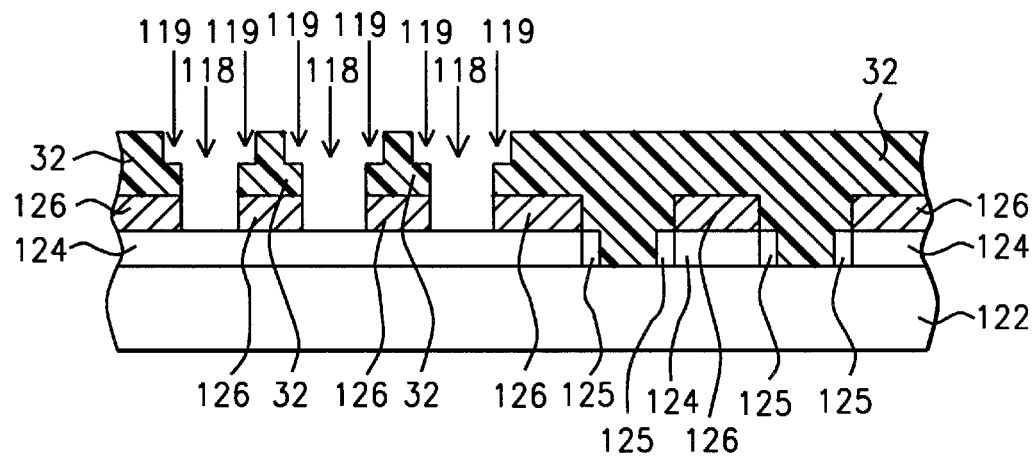
Figure 16:
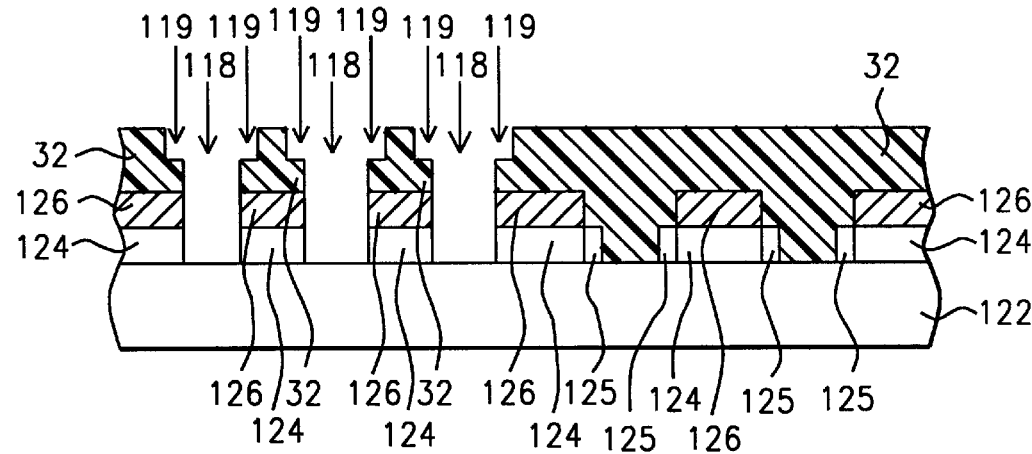
Figure 17:
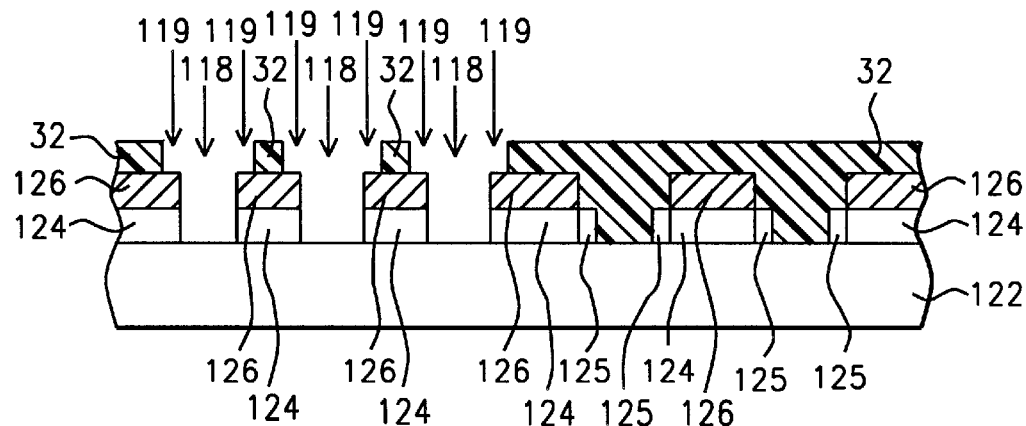
Figure 18:
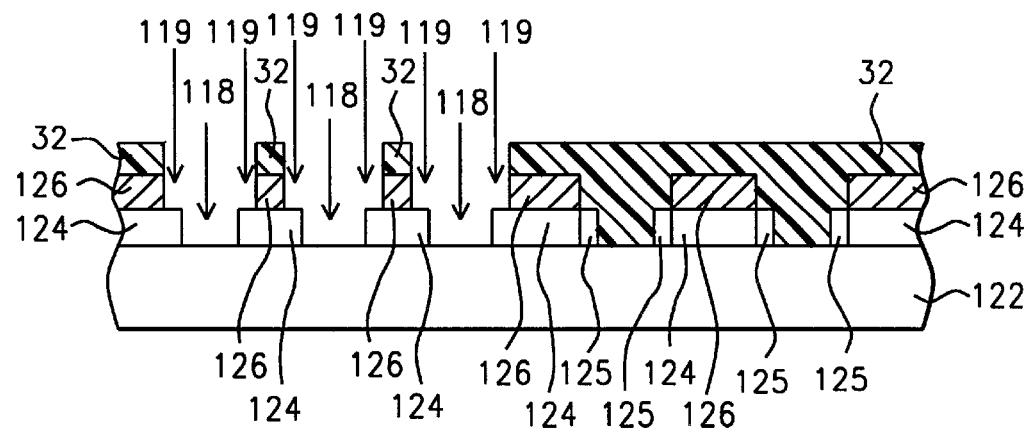
Figure 19:
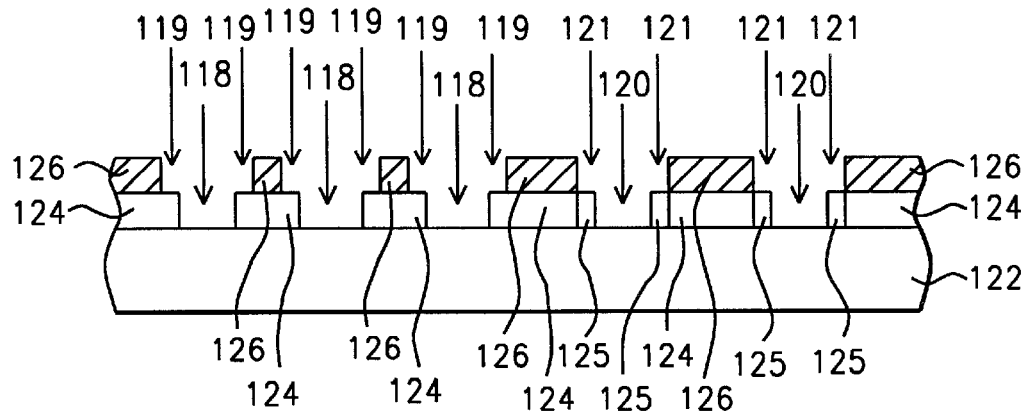

Next, as shown in FIG. 13, a second layer of resist 32 is formed on the mask and a second pattern is exposed in the layer of second resist using an exposure method such as an electron beam 30. As shown in FIG. 14, the layer of second resist 32 is then developed forming a mask corresponding to the second pattern, which is the part of the mask having the dense holes. The exposure level of the layer of second resist 32 varies with position so that the second resist at the location of the dense holes 118 is fully exposed and completely removed and the second resist at the location of the rims 119 surrounding the dense holes 118 is partially exposed and partially removed by the developing. As shown in FIG. 15 the dense holes 118 are etched in the layer of opaque material 126 using the first etching means. The first etching means is wet etching using an etchant such as CR-7, $Cl(HClO_4)_x(NO_3)y$. As shown in FIG. 16 the dense holes 118 are then etched in the layer of attenuating phase shifting material 124, which has not been treated with either the first solution or the second solution, using the second etching means. The second etching means is dry anisotropic etching using an etchant such as $SF_6$+He or $CF_4$+02. Next, as shown in FIG. 17, part of the layer of second resist 32 is removed using $O_2$ plasma dry etching thereby exposing a rim 1191 of opaque material 126. As shown in FIG. 18, the rim of exposed opaque material is etched away using the third etching means thereby exposing a rim 119 of attenuating phase shifting material 124 surrounding the dense holes 118. The third etching means is dry anisotropic etching. As shown in FIG. 19, the layer of second resist is then stripped to complete the mask.

The completed mask 46, shown in FIG. 19, has a rim 119 of first attenuating phase shifting material 124, having a first transmittance and providing a phase shift of 180°, surrounding the dense holes 118 and a rim 121 of second attenuating phase shifting material 125, having a second transmittance and providing a phase shift of 180°, surrounding the isolated holes 120. The second transmittance is greater than the first transmittance. In this example the first attenuating phase shifting material is MoSiON, the second phase shifting material is MoSiON which has been treated with solutions of SC1 and NaOH, the first transmittance is between about 5% and 7%, and the second transmittance is between about 10% and 20%.

Figure 24:
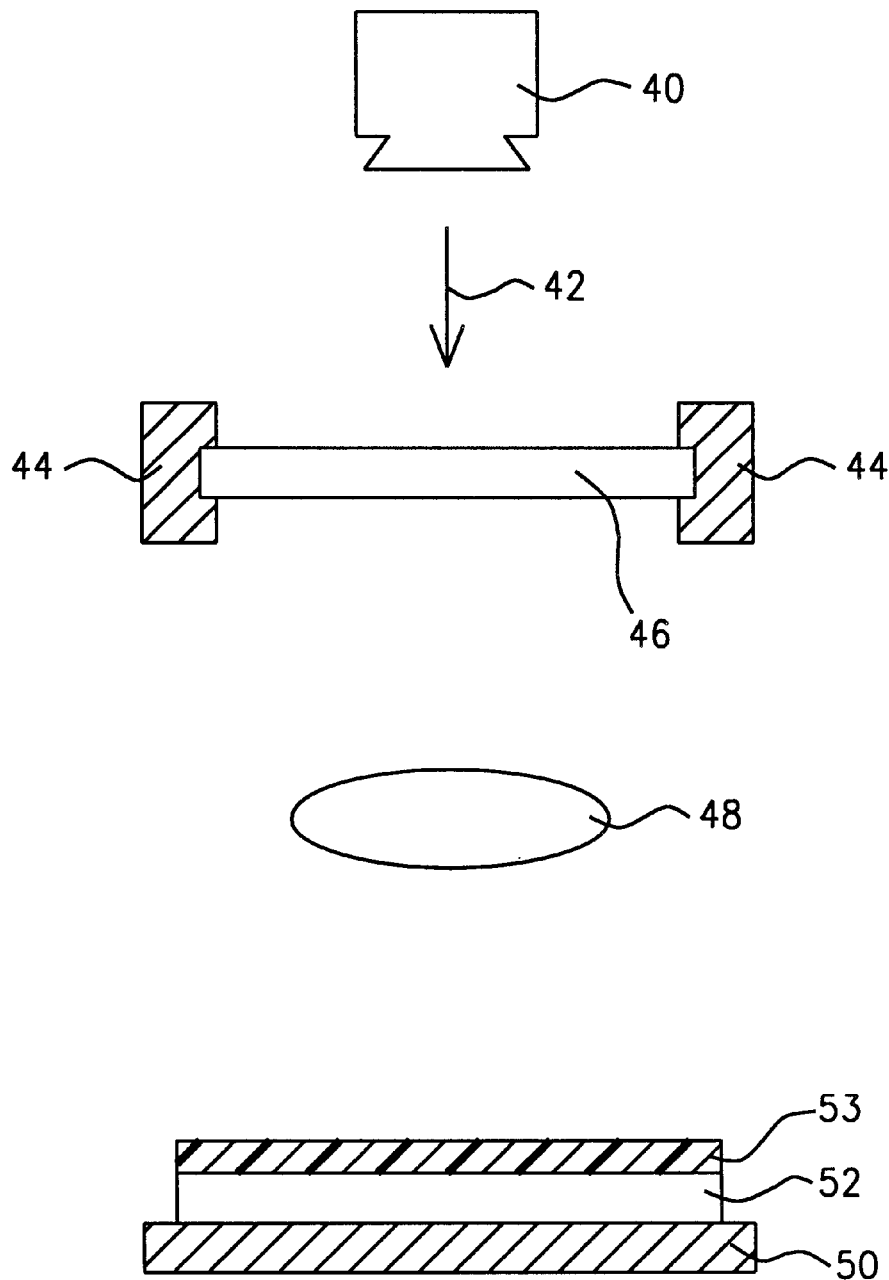
FIG. 24 shows a schematic view of a projection exposure system.

Refer now to FIGS. 19 and 24 for a preferred embodiment of the method of this invention of exposing a pattern in a layer of photosensitive dielectric material. FIG. 24 shows a schematic view of a projection exposure system having an illumination system 40, a mask holder 44, an objective lens 48, and a wafer holder 50. The sigma of the light 42 from the illumination system 40 can be varied by the illumination system 40. The value of sigma is a measure of the degree of coherence of the light 42 from the illumination system. For completely coherent light the value of sigma is zero. For incoherent light the value of sigma is 1.0. The mask 46 shown in FIG. 19 is placed in the mask holder 44 and a wafer 52 having a layer of photosensitive dielectric 53, such as photoresist, is placed on the wafer holder 50. The mask 46 placed in the wafer holder 44 is shown in FIG. 19. The mask 46 has a rim 119 of first attenuating phase shifting material 124, having a first transmittance and providing a phase shift of 180°, surrounding the dense holes 118 and a rim 121 of second attenuating phase shifting material 125, having a second transmittance and providing a phase shift of 180°, surrounding the isolated holes 120. The second transmittance is greater than the first transmittance. The dense 118 holes have a duty ratio of less than 2.0 and the isolated holes 120 have a duty ratio of greater than or equal to 2.0.

The value of sigma for light 42 from the illumination system 40 is increased from the typical value of about 0.6 to about 0.8. The value of sigma is a measure of the degree of coherence of the light 42 from the illumination system 40. For completely coherent light the value of sigma is zero. For incoherent light the value of sigma is 1.0. Projection systems typically use light having a value of sigma of about 0.6. The light 42, having a value of sigma of about 0.8, is then used to project the image of the mask 46 on the layer of photosensitive dielectric 53, thereby exposing the layer of photosensitive dielectric 53. The increased sigma value prevents side lobe effects from occurring in the region of the pattern having the dense holes. The increased transmittance of the attenuating phase shifting material forming the rim around the isolated holes provides improved depth of focus in the region of the pattern having the isolated holes. The layer of photosensitive dielectric is then developed.

While the invention has been particularly shown and described with reference to the preferred embodiments thereof, it will be understood by those skilled in the art that various changes in form and details may be made without departing from the spirit and scope of the invention.

What is claimed is:

1. A method of forming an attenuating phase shifting mask, comprising:

providing a transparent mask substrate having a layer of attenuating phase shifting material formed on said transparent mask substrate and a layer of opaque material formed on said layer of attenuating phase shifting material, wherein said layer of attenuating phase shifting material has a first transmittance and provides a first phase shift;

forming a first number of first holes and a second number of second holes in said layer of opaque material and said layer of attenuating phase shifting material;

removing that part of said opaque material within a first width of the outer perimeter of said first holes and within a second width of the outer perimeter of said second holes, thereby exposing a first region of said attenuating phase shifting material surrounding each of said first holes and a second region of said attenuating phase shifting material surrounding each of said second holes;

treating said second region of said attenuating phase shifting material with a first solution for a first time, thereby changing the transmittance of said attenuating phase shifting material in said second region to a second transmittance and the phase shift provided by said attenuating phase shifting material in said second region to a second phase shift; and treating said second region of attenuating phase shifting material with a second solution for a second time, after treating said second region of attenuating phase shifting material with said first solution for said first time, thereby changing the transmittance of said attenuating phase shifting material in said second region to a third transmittance and the phase shift provided by said attenuating phase shifting material in said second region to said first phase shift.

2. The method of claim 1 wherein the distance between the outer perimeter of adjacent said first holes divided by the width of said first holes is less than 2.0 and the distance between the outer perimeter of adjacent said second holes divided by the width of said second holes is greater than or equal to 2.0.

3. The method of claim 1 wherein said attenuating phase shifting material is MoSiON and said first solution is a 1:1:5 solution of $NH_4OH:H_2O_2:H_2O$.

4. The method of claim 1 wherein said attenuating phase shifting material is MoSiON and said second solution is a solution of NaOH.

5. The method of claim 1 wherein said first phase shift is about 180°.

6. The method of claim 1 wherein said first transmittance is between about 5% and 7%.

7. The method of claim 1 wherein said second transmittance is between about 10% and 20%.

8. A method of exposing a pattern in a layer of photosensitive dielectric material, comprising:

providing a phase shifting mask having a first pattern comprising a first number of transparent first holes having a first width; said first number of first rims surrounding each of said first holes, wherein each of said first rims is formed of a first attenuating phase shifting material having a first transmittance and provides a first phase shift to light passing through said first rims relative to light passing through said first holes; a second number of transparent second holes having a second width; said second number of second rims surrounding each of said second holes, wherein each of said second rims is formed of a second attenuating phase shifting material having a second transmittance and provides said first phase shift to light passing through said second rims relative to light passing through said second holes; and opaque material formed on those regions of the mask not covered by said first holes, said first rims, said second holes, or said second rims;

providing a photolithographic exposure system comprising a wafer holder, a mask holder, and an illumination system having a numerical aperture and a sigma;

providing a wafer having a layer of photosensitive dielectric material formed thereon;

exposing said pattern on said layer of photosensitive dielectric material with light from said illumination system using said mask and said photolithographic exposure system; and developing said photosensitive dielectric material.

9. The method of claim 8 wherein said numerical aperture is about 0.6 and said sigma is about 0.8.

10. The method of claim 8 wherein the distance between the outer perimeter of adjacent said first holes divided by the width of said first holes is less than 2.0 and the distance between the outer perimeter of adjacent said second holes divided by the width of said second holes is greater than or equal to 2.0.

11. The method of claim 8 wherein said first phase shift is about 180°.

12. The method of claim 8 wherein said first attenuating phase shifting material is MoSiON and said second attenuating phase shifting material is MoSiON which has been treated with a 1:1:5 solution of $NH_4OH:H_2O_2:H_2O$ for a first time and a NaOH solution for a second time.

13. The method of claim 8 wherein said first transmittance is between about 5% and 7%.

14. The method of claim 8 wherein said third transmittance is between about 10% and 20%.

15. A phase shifting mask, comprising:

a first number of transparent first holes having a first width, wherein said first holes have a first duty ratio wherein said first duty ratio is equal to the distance between the outer perimeter of adjacent said first holes divided by said first width;

said first number of first rims surrounding each of said first holes, wherein each of said first rims is formed of a first attenuating phase shifting material having a first transmittance and providing a first phase shift to light passing through said first rims relative to light passing through said first holes;

a second number of transparent second holes having a second width, wherein said second holes have a second duty ratio wherein said second duty ratio is equal to the distance between the outer perimeter of adjacent said second holes divided by said second width;

said second number of second rims surrounding each of said second holes, wherein each of said second rims is formed of a second attenuating phase shifting material having a second transmittance and providing a second phase shift to light passing through said second rims relative to light passing through said second holes; and opaque material formed on those regions of the mask not covered by said first holes, said first rims, said second holes, or said second rims.

16. The mask of claim 15 wherein said first phase shift and said second phase shift are 180°.

17. The mask of claim 15 wherein said first duty ratio is less than about 2.0.

18. The mask of claim 15 wherein said second duty ratio is greater than or equal to about 2.0.

19. The mask of claim 15 wherein said first attenuating phase shifting material is MoSiON and said second phase shifting material is MoSiON which has been treated with a 1:1:5 solution of $NH_4OH:H_2O_2:H_2O$ for a first time and a NaOH solution for a second time.

20. The mask of claim 15 wherein said first transmittance is between about 5% and 7%.

21. The mask of claim 15 wherein said second transmittance is between about 10% and 20%.

* * * * *